(12) United States Patent
Hallack

(10) Patent No.: US 10,029,615 B2
(45) Date of Patent: *Jul. 24, 2018

(54) BIMODAL MECHANISM WITH OPTICAL SWITCH

(71) Applicant: Gentex Corporation, Zeeland, MI (US)

(72) Inventor: Jason D. Hallack, Allendale, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/376,812

(22) Filed: Dec. 13, 2016

(65) Prior Publication Data

US 2017/0166133 A1    Jun. 15, 2017

Related U.S. Application Data

(60) Provisional application No. 62/267,249, filed on Dec. 14, 2015.

(51) Int. Cl.
*B60R 1/04* (2006.01)
*H01R 12/70* (2011.01)
(Continued)

(52) U.S. Cl.
CPC ............ *B60R 1/04* (2013.01); *B60R 1/12* (2013.01); *G02B 5/08* (2013.01); *G02F 1/15* (2013.01);
(Continued)

(58) Field of Classification Search
CPC .. B60R 1/04; B60R 1/12; B60R 1/087; G02B 5/08; G02B 5/04; G02F 1/15; G02F 2001/1512; H01R 12/7076
(Continued)

(56) References Cited

U.S. PATENT DOCUMENTS 3,740,122 A    6/1973 Stern
4,428,649 A *  1/1984 Main ................ B60R 1/07
                                            200/1 V
(Continued)

FOREIGN PATENT DOCUMENTS

JP    10-302578    * 11/1998    ............. B60R 1/06
JP    2003-217403  *  7/2003    ............. H01H 25/04
(Continued)

OTHER PUBLICATIONS

International Search Report and Written Opinion of the International Searching Authority, or the Declaration, dated Apr. 20, 2017, for International Application No. PCT/US2016/066326, filed Dec. 13, 2016, 8 pages.

*Primary Examiner* — Frank Font
(74) *Attorney, Agent, or Firm* — Price Heneveld LLP; Bradley D. Johnson

(57) ABSTRACT

A mirror assembly for a vehicle is disclosed. The mirror assembly comprises a support bracket, a glass element operably coupled with the support bracket, and an actuator assembly. The actuator assembly is in connection with the support bracket, wherein the actuator assembly is adjustable to tilt the glass element to a first position and to a second position. A damper is in engagement with the actuator assembly and the support bracket. The damper controls a movement of the actuator assembly corresponding to the movement of the glass element from the first position to the second position. The mirror assembly further comprises a sensor configured to detect a position of the actuator assembly.

19 Claims, 10 Drawing Sheets

(51) Int. Cl.
*G02B 5/08* (2006.01)
*G02F 1/15* (2006.01)
B60R 1/12 (2006.01)
B60R 1/08 (2006.01)
*G02B 5/04* (2006.01)
*H05K 1/02* (2006.01)

(52) U.S. Cl.
CPC ........ *B60R 2001/1253* (2013.01); *G02B 5/04* (2013.01); *G02F 2001/1512* (2013.01); *H05K 1/0212* (2013.01)

(58) Field of Classification Search
USPC .................. 359/877; 307/10.1; 200/336
See application file for complete search history.

(56) References Cited

U.S. PATENT DOCUMENTS

| | | | |
|---|---|---|---|
| 4,435,042 A | | 3/1984 | Wood et al. |
| 4,611,102 A | * | 9/1986 | Ishida .................. H01H 25/041 200/5 R |
| 4,698,464 A | * | 10/1987 | Tanaka ................. B60R 16/005 200/16 D |
| 4,975,547 A | * | 12/1990 | Nakayama ............... B60R 1/07 200/16 C |
| 5,233,228 A | * | 8/1993 | Krieg ....................... B60R 1/02 200/4 |
| 5,450,246 A | * | 9/1995 | Jain ........................ B60R 1/068 359/606 |
| 5,500,766 A | * | 3/1996 | Stonecypher ........... B60R 1/081 359/605 |
| 5,928,572 A | | 7/1999 | Tonar et al. |
| 5,998,617 A | | 12/1999 | Srinivasa et al. |
| 6,020,987 A | | 2/2000 | Baumann et al. |
| 6,037,471 A | | 3/2000 | Srinivasa et al. |
| 6,137,620 A | | 10/2000 | Guarr et al. |
| 6,141,137 A | | 10/2000 | Byker et al. |
| 6,193,912 B1 | | 2/2001 | Thieste et al. |
| 6,241,916 B1 | | 6/2001 | Claussen et al. |
| 6,249,369 B1 | | 6/2001 | Thieste et al. |
| 6,519,072 B2 | | 2/2003 | Nishikitani et al. |
| 6,572,233 B1 | | 6/2003 | Northman et al. |
| 6,598,980 B2 | | 7/2003 | Marusawa et al. |
| 7,249,860 B2 | | 7/2007 | Kulas et al. |
| 8,201,800 B2 | | 6/2012 | Filipiak |
| 8,210,695 B2 | | 7/2012 | Roth et al. |
| 8,237,909 B2 | | 8/2012 | Ostreko et al. |
| 8,264,761 B2 | | 9/2012 | Cammenga et al. |
| 8,643,931 B2 | | 2/2014 | Cammenga et al. |
| 8,646,924 B2 | | 2/2014 | Roth et al. |
| 8,814,373 B2 | | 8/2014 | Steel et al. |
| 8,827,517 B2 | | 9/2014 | Cammenga et al. |
| 8,879,139 B2 | | 11/2014 | Fish, Jr. et al. |
| 8,885,240 B2 | | 11/2014 | Roth et al. |
| 8,925,891 B2 | | 1/2015 | Van Huis et al. |
| 9,174,577 B2 | | 11/2015 | Busscher et al. |
| 9,575,315 B2 | | 2/2017 | Lee et al. |
| 2012/0327234 A1 | | 12/2012 | Fish, Jr. et al. |
| 2013/0112532 A1 | * | 5/2013 | Suzuki .................. G05G 9/047 200/4 |
| 2017/0080867 A1 | * | 3/2017 | Hallack ................... B60R 1/04 |
| 2017/0210294 A1 | * | 7/2017 | Mohan ..................... B60R 1/04 |

FOREIGN PATENT DOCUMENTS

WO 9842796 A1 10/1998
WO 9902621 A1 1/1999

* cited by examiner

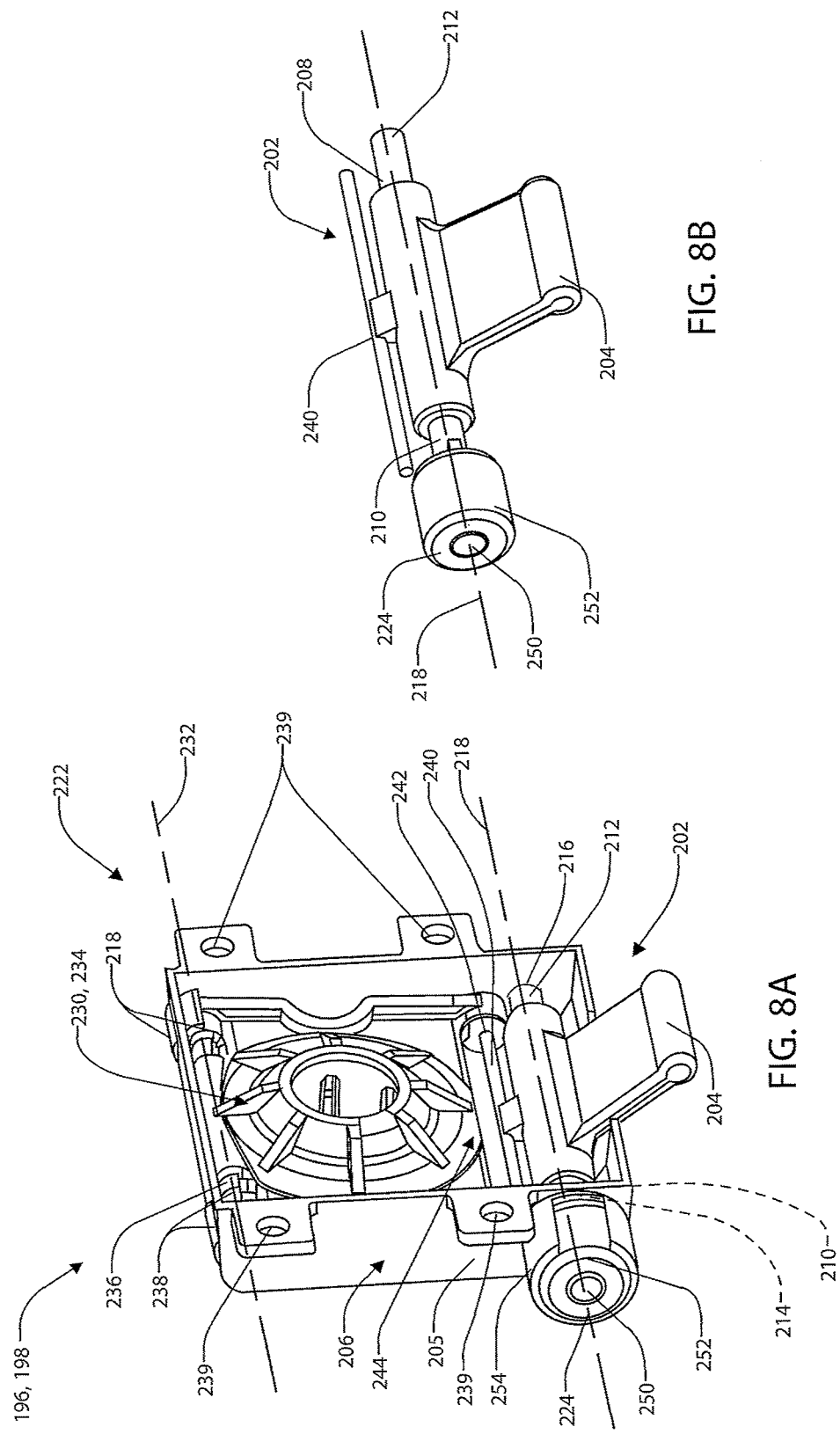

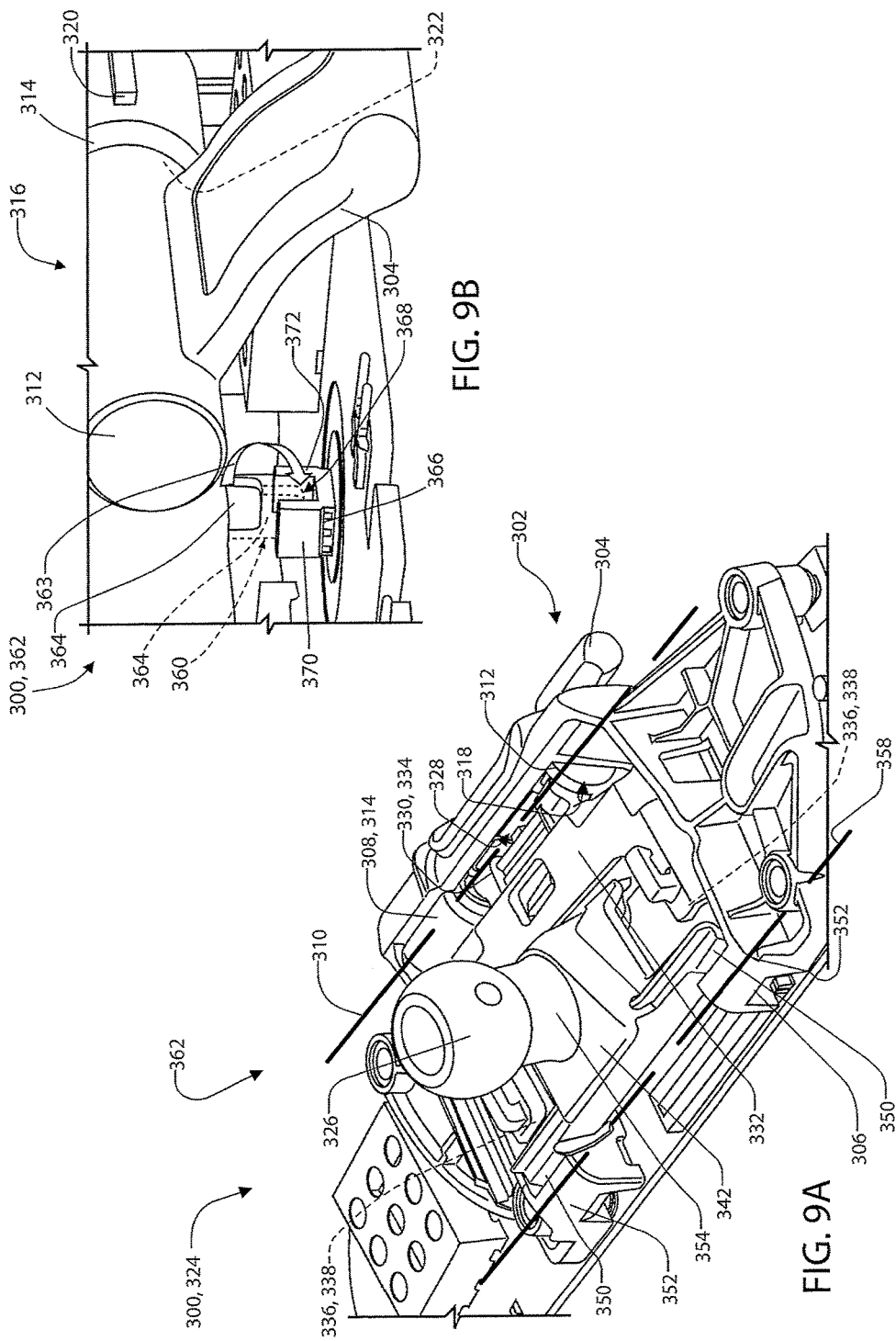

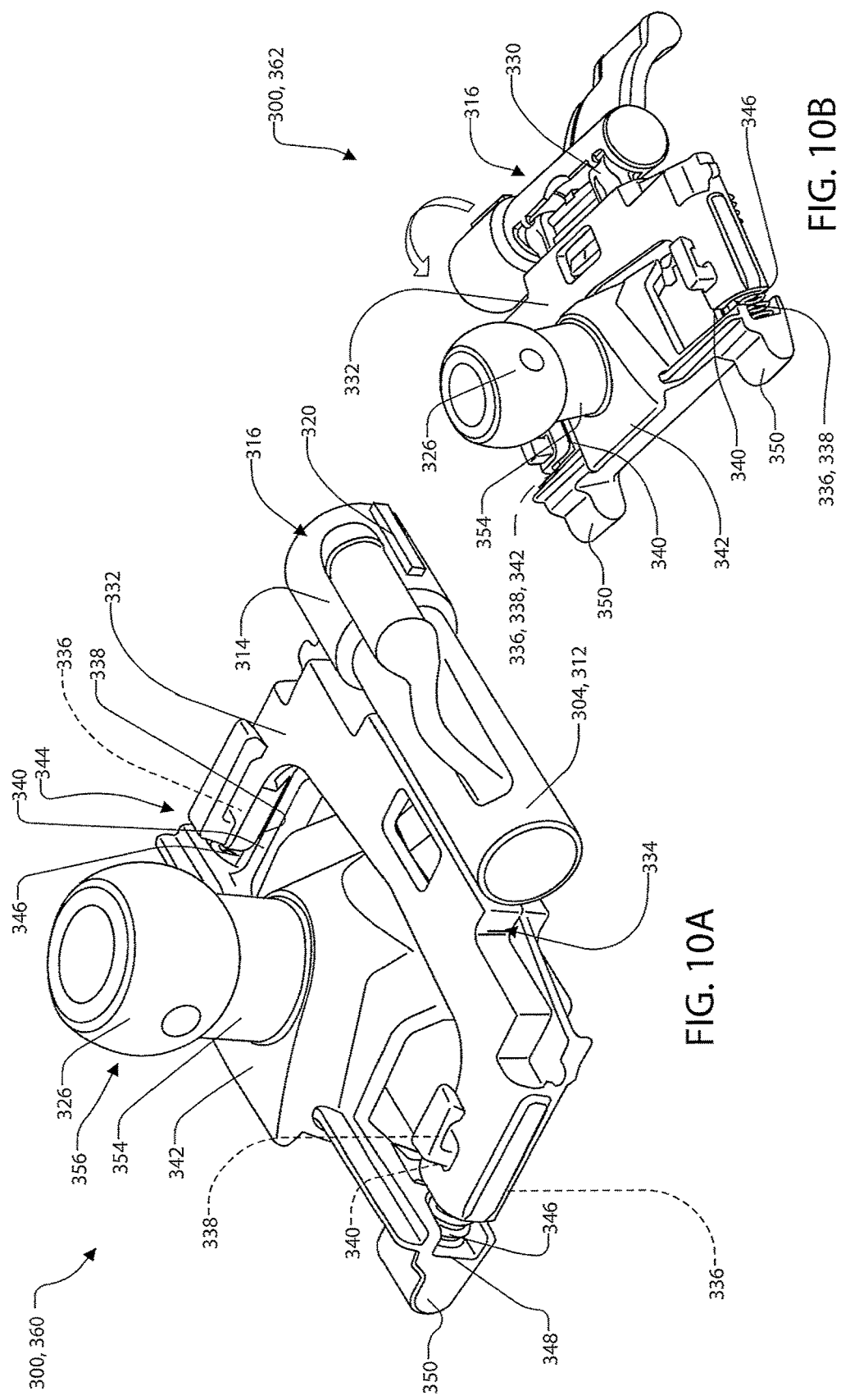

BIMODAL MECHANISM WITH OPTICAL SWITCH

CROSS-REFERENCE TO RELATED APPLICATION

This application claims benefit to U.S. Provisional Application No. 62/267,249, filed on Dec. 14, 2015, entitled "BIMODAL MECHANISM WITH OPTICAL SWITCH," the disclosure of which is hereby incorporated herein by reference in its entirety.

BACKGROUND OF THE INVENTION

The present invention generally relates to a rearview device system, and more particularly, a display mirror assembly having a partially reflective, partially transmissive element and a display behind the reflective element.

SUMMARY OF THE INVENTION

One aspect of the disclosure includes a mirror assembly for a vehicle. The mirror assembly comprises a support bracket, a glass element operably coupled with the support bracket, and an actuator assembly. The actuator assembly is in connection with the support bracket, wherein the actuator assembly is adjustable to tilt the glass element to a first position and to a second position. A damper is in engagement with the actuator assembly and the support bracket. The damper controls a movement of the actuator assembly corresponding to the movement of the glass element from the first position to the second position. The mirror assembly further comprises a sensor configured to detect a position of the actuator assembly.

Another aspect of the disclosure includes a mirror assembly for a vehicle. The assembly comprises a support bracket and a glass element operably coupled with the support bracket. The assembly further comprises an actuator assembly in connection with the support bracket. The actuator assembly is adjustable to tilt the glass element between a first position and a second position. A damper is in engagement with the actuator assembly and the support bracket. The damper controls a movement of the actuator assembly between the first position and the second position. Additionally, the assembly comprises a sensor configured to detect a position of the actuator assembly.

Yet another aspect of the disclosure includes a mirror assembly for a vehicle. The assembly comprises a support bracket, a display screen, and a glass element. The display screen comprises a display surface configured to display image data. The glass element is disposed on the display surface and operably coupled with the support bracket. The assembly further comprises an actuator assembly in connection with the support bracket. The actuator assembly is adjustable to tilt the glass element between a first position and a second position. A damper is in engagement with the actuator assembly and the support bracket. The damper controls a movement of the actuator assembly between the first position and the second position. Additionally, the assembly comprises a sensor configured to detect a position of the actuator assembly.

These and other features, advantages, and objects of the present invention will be further understood and appreciated by those skilled in the art by reference to the following specification, claims, and appended drawings.

BRIEF DESCRIPTION OF THE DRAWINGS

FIG. 8A is a perspective view of a positioning assembly for the display mirror;

FIG. 8B is a perspective view of a toggle mechanism of the positioning assembly; and FIG. 9A is a projected view of a partial assembly of a positioning assembly comprising a sensor configured to detect a position of a glass element;

FIG. 9B is a projected view of a partial assembly of the positioning assembly demonstrated in FIG. 9A;

FIG. 10A is a projected view of a partial assembly of the positioning assembly demonstrated in FIG. 9A; and FIG. 10B is a projected view of a partial assembly of the positioning assembly demonstrated in FIG. 9A.

DETAILED DESCRIPTION

Figure 1:
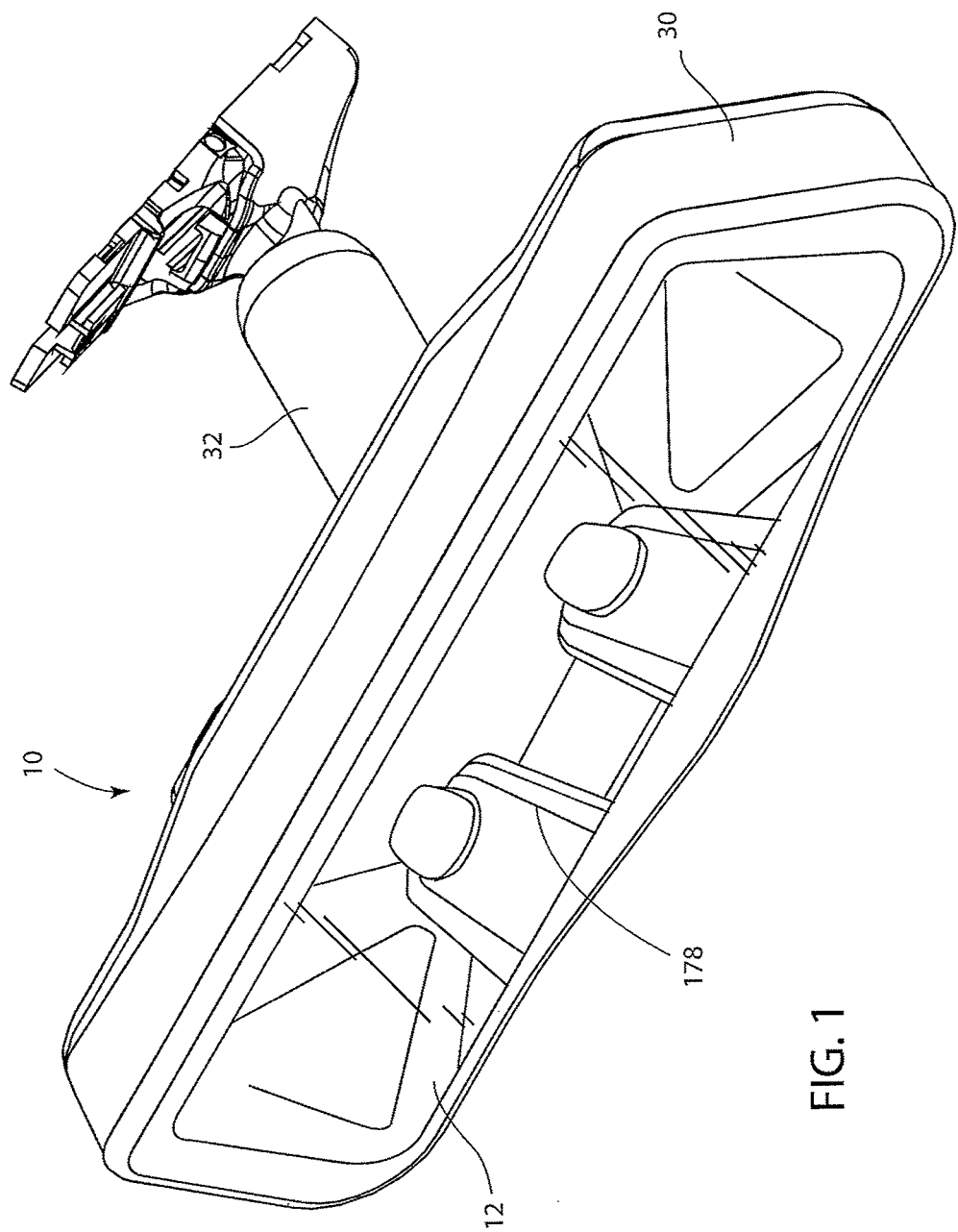
FIG. 1 is a top front perspective view of a display mirror assembly for a vehicle.

The present illustrated embodiments reside primarily in combinations of method steps and apparatus components related to a display mirror. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof shall relate to the invention as oriented in FIG. 1. Unless stated otherwise, the term "front" shall refer to the surface of the element closer to an intended viewer of the display mirror, and the term "rear" shall refer to the surface of the element further from the intended viewer of the display mirror. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Figure 2:
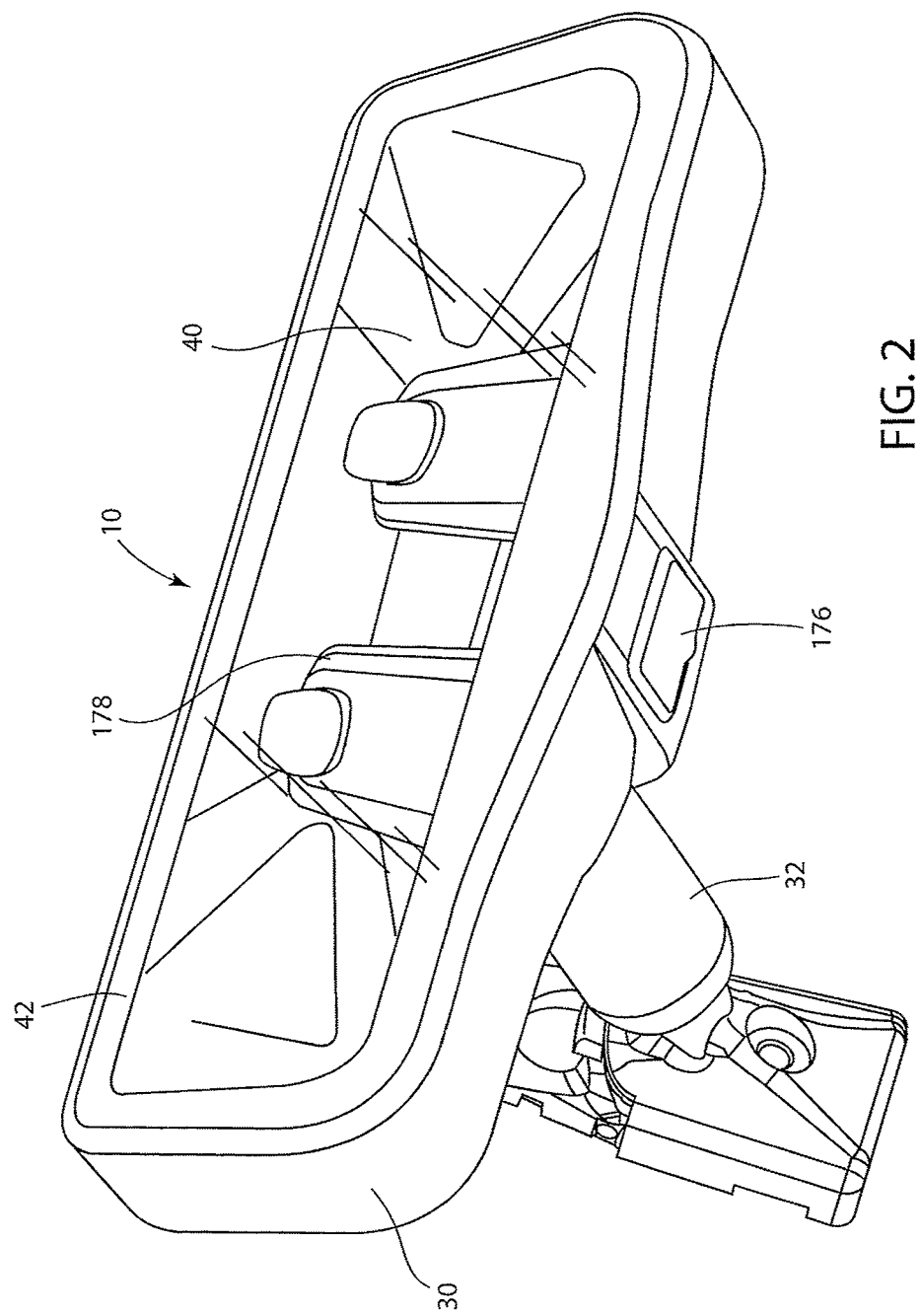
FIG. 2 is a bottom front perspective view of the display mirror assembly of FIG. 1.
Figure 3:
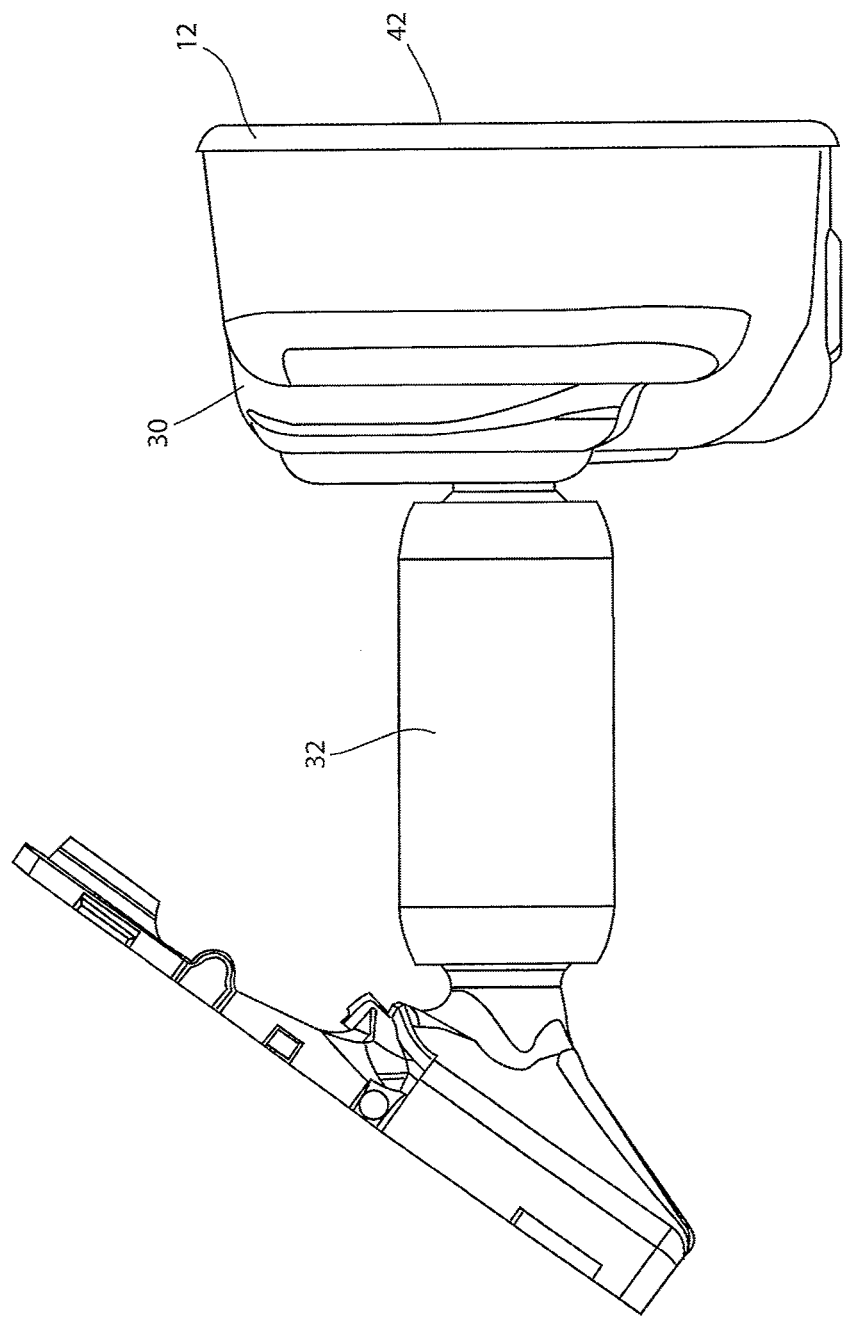
FIG. 3 is a side elevation view of the display mirror assembly of FIG. 1.
Figure 4:
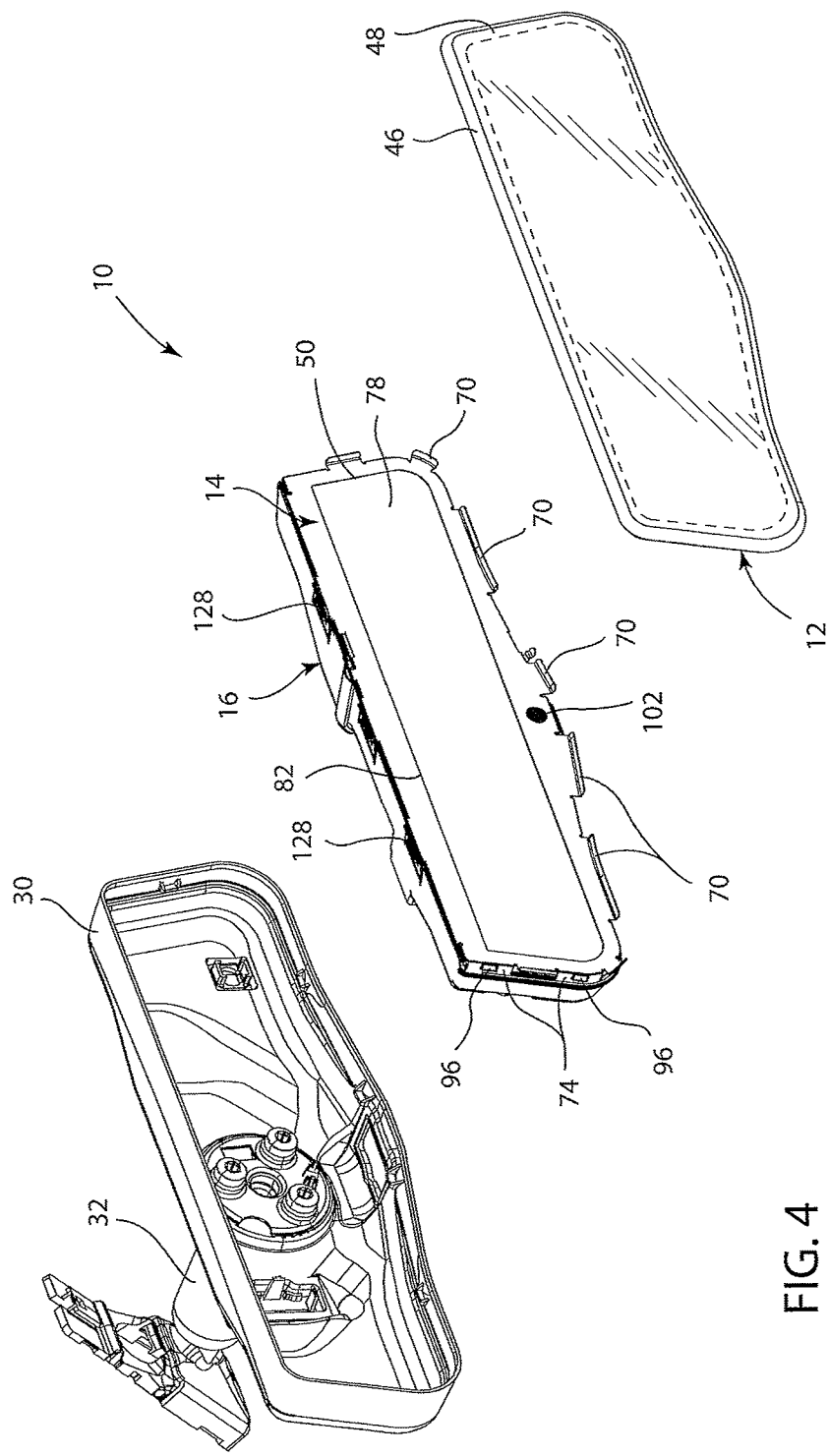
FIG. 4 is a partially exploded top perspective view of the display mirror assembly of FIG. 1.
Figure 5:
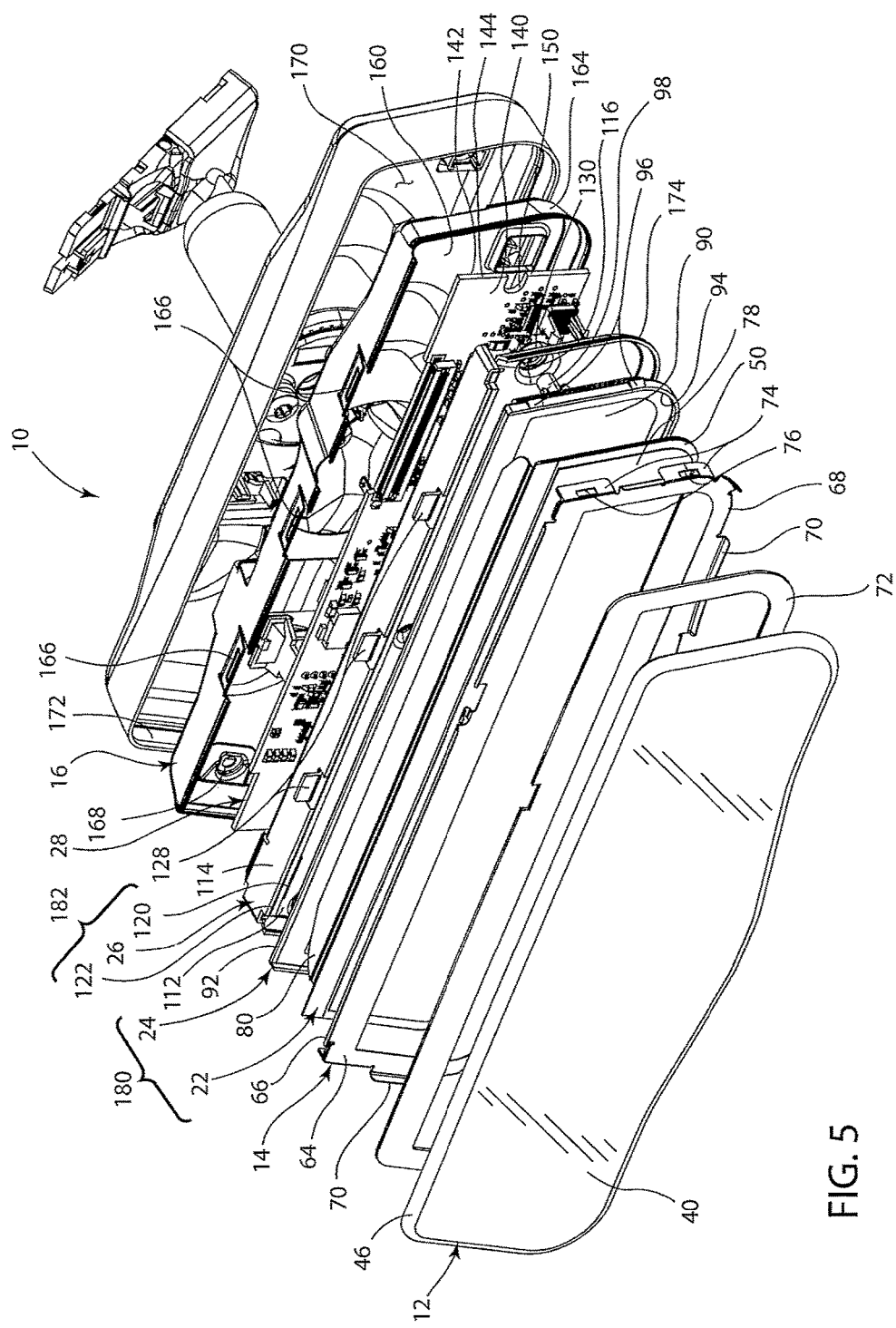
FIG. 5 is a partially exploded top perspective view of the display mirror assembly of FIG. 1.
Figure 6:
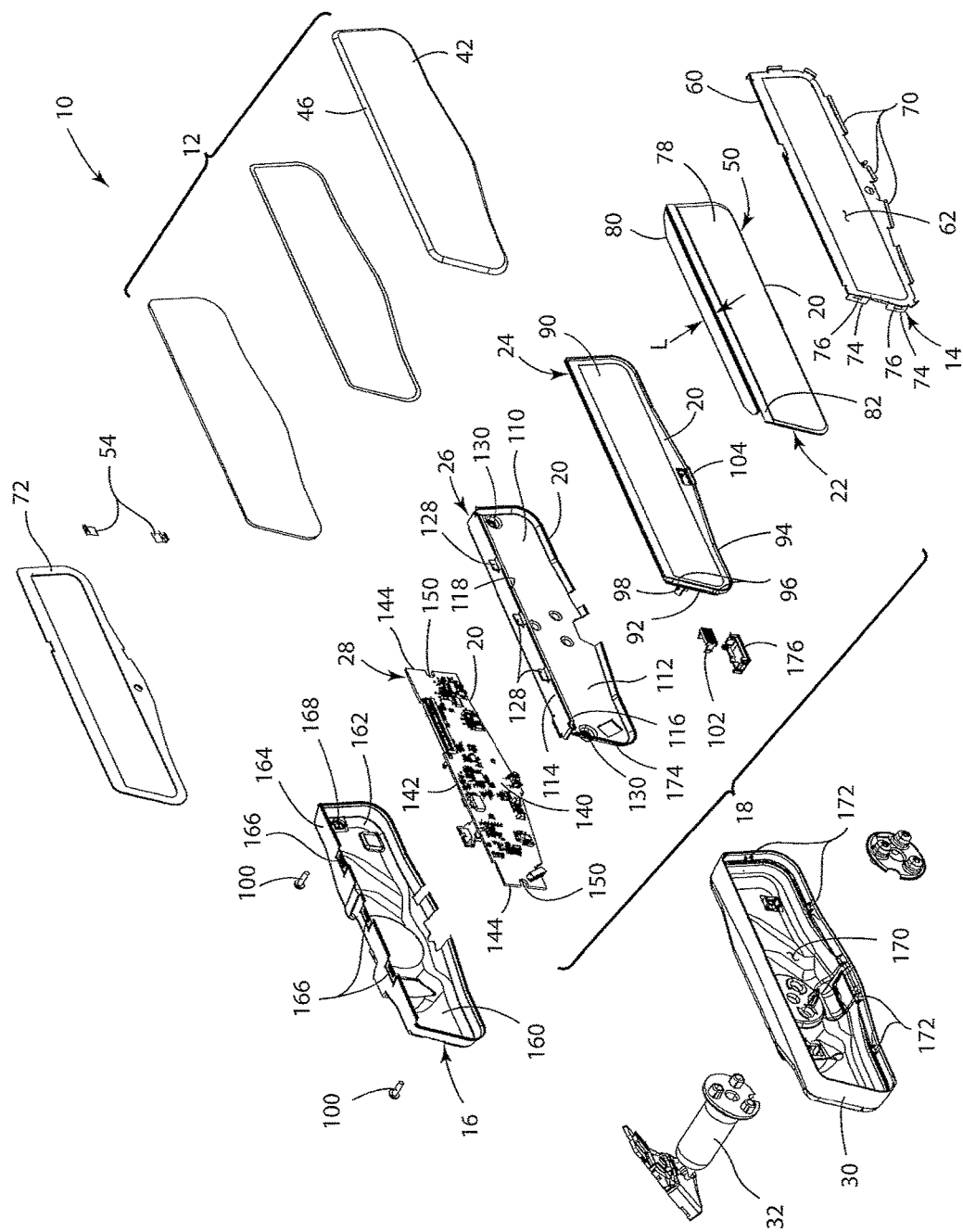
FIG. 6 is an exploded top perspective view of the display mirror assembly of FIG. 1.

Referring now to FIGS. 1-3, reference numeral 10 generally designates a display mirror assembly for a vehicle. The display mirror assembly 10 includes a partially reflective, partially transmissive element 12 (also referred to as a "glass element" herein) and a display module 18 (FIG. 6) that is viewed through the partially reflective, partially transmissive element 12. As shown in FIG. 4, the display mirror assembly 10 further includes a front shield 14 and a rear shield 16 which shield and support the partially reflective, partially transmissive element 12 and the display module 18 (FIG. 6). As shown in FIGS. 5-6, the display module 18 generally includes several components 20, including a display 22, an optic block 24, a heat sink 26, and a primary PCB 28. A housing 30 at least partially receives the front shield 14, the display module 18, and the rear shield 16, and includes a mounting member 32 extending rearwardly therefrom. The mounting member 32 is adapted for mounting on a windshield of a vehicle.

Referring generally to FIGS. 1-3, the display mirror assembly 10 has a viewing area 40, which includes a front surface 42 of the glass element 12. The viewing area 40 may be a rectangular shape, a trapezoidal shape, or any custom contoured shape desired for aesthetic reasons.

Referring to FIG. 4, the display mirror assembly 10 for a vehicle is shown, with the components partially exploded. The display mirror assembly 10 includes the glass element 12, the front shield 14 and the rear shield 16 encapsulating the display module 18, the rear housing 30, and the mounting member 32. As shown in FIGS. 4-6, the front shield 14, the rear shield 16, and components of the display module 18 include various retaining features to operably connect the several components of the display module 18 with the front shield 14, the rear shield 16 and each other, and to provide support to the display module 18. Specifically, the front shield 14 includes retaining features to operably connect the front shield 14 to the display module 18, and the rear shield 16 has retaining features to operably connect the rear shield 16 to the display module 18. The retaining features generally include snap fit connections, tab and slot connections, screw connections, and other known retaining features. Some or all of the retaining features may also be strengthened by the addition of adhesive compounds. Certain non-limiting illustrative examples of retaining features are described in detail herein.

The display mirror assembly 10 will hereafter be described in greater detail, beginning with the elements closest to the intended viewer, and extending rearwardly away from the viewer.

As shown in FIG. 4, the glass element 12 is generally planar, with an outer perimeter 46 and a border 48 around the outer perimeter 46. The border 48 may incorporate a chrome ring or other similar finish to conceal the front shield 14 and other elements located behind the glass element 12 in the display mirror assembly 10, including without limitation a seal on an electrochromic unit, an applique, foam adhesive, or pad printing. The border 48 may extend from the outer perimeter 46 of the glass element 12 to an outer edge 50 of the display 22. Alternatively, the border 48 may be narrower and not reach from the outer perimeter 46 to the outer edge 50 of the display 22 along at least some portions of the border 48. The perimeter of the glass element 12 may also have a ground edge, a beveled edge, or be frameless.

The glass element 12 may be an electro-optic element or an element such as a prism. One non-limiting example of an electro-optic element is an electrochromic medium, which includes at least one solvent, at least one anodic material, and at least one cathodic material. Typically, both of the anodic and cathodic materials are electroactive and at least one of them is electrochromic. It will be understood that regardless of its ordinary meaning, the term "electroactive" will be defined herein as a material that undergoes a modification in its oxidation state upon exposure to a particular electrical potential difference. Additionally, it will be understood that the term "electrochromic" will be defined herein, regardless of its ordinary meaning, as a material that exhibits a change in its extinction coefficient at one or more wavelengths upon exposure to a particular electrical potential difference. Electrochromic components, as described herein, include materials whose color or opacity are affected by electric current, such that when an electrical current is applied to the material, the color or opacity change from a first phase to a second phase. The electrochromic component may be a single-layer, single-phase component, multi-layer component, or multi-phase component, as described in U.S. Pat. No. 5,928,572 entitled "Electrochromic Layer And Devices Comprising Same," U.S. Pat. No. 5,998,617 entitled "Electrochromic Compounds," U.S. Pat. No. 6,020,987 entitled "Electrochromic Medium Capable Of Producing A Pre-selected Color," U.S. Pat. No. 6,037,471 entitled "Electrochromic Compounds," U.S. Pat. No. 6,141,137 entitled "Electrochromic Media For Producing A Pre-selected Color," U.S. Pat. No. 6,241,916 entitled "Electrochromic System," U.S. Pat. No. 6,193,912 entitled "Near Infrared-Absorbing Electrochromic Compounds And Devices Comprising Same," U.S. Pat. No. 6,249,369 entitled "Coupled Electrochromic Compounds With Photostable Dication Oxidation States," and U.S. Pat. No. 6,137,620 entitled "Electrochromic Media With Concentration Enhanced Stability, Process For The Preparation Thereof and Use In Electrochromic Devices"; U.S. Pat. No. 6,519,072, entitled "Electrochromic Device"; and International Patent Application Publication Nos. WO 1998/42796 entitled "Electrochromic Polymeric Solid Films, Manufacturing Electrochromic Devices Using Such Solid Films, And Processes For Making Such Solid Films And Devices," and WO 1999/02621 entitled "Electrochromic Polymer System," which are herein incorporated by reference in their entirety. The glass element 12 may also be any other element having partially reflective, partially transmissive properties. To provide electric current to the glass element 12, electrical elements are provided on opposing sides of the element, to generate an electrical potential therebetween. A J-clip 54 is electrically engaged with each electrical element, and element wires extend from the J-clips 54 to the primary PCB 28.

Now referring to FIGS. 5-6, the front shield 14 functions to shield the display module 18 from radio frequency (RF) electromagnetic radiation and to provide support for the glass element 12 and the display module 18. The front shield 14 is formed from one or more materials which are suitable to block RF radiation, including without limitation steel. As a non-limiting example, the front shield 14 can be formed from a stamped steel material which is about 0.2 mm thick.

Also as shown in FIGS. 5-6, the front shield 14 is generally shaped in the form of a ring 60 having an opening 62 therethrough. The front shield 14 has a front side 64, rear side 66, and an outer surface 68 which is generally coextensive with the outer perimeter 46 of the glass element 12. The front shield 14 includes retaining features 70 extending forwardly therefrom, to mechanically engage the glass element 12. An adhesive, such as a foam adhesive 72, may also be used to secure the glass element 12 to the front shield 14. The front shield 14 further includes rearwardly directed tabs 74 to operably engage the rear shield 16 (or a component of the display module 18). The rearwardly directed tabs 74 further include holes 76 therethrough, to operably engage at least one component of the display module 18, such as the optic block 24.

As best shown in FIG. 6, the display module 18 is disposed behind the front shield 14, with the display 22 viewable through the opening 62 in the front shield 14. The components of the display module 18 are ordered, from the front shield 14 toward the rear shield 16, the display 22, the optic block 24, the heat sink 26, and the primary PCB 28.

The display 22 is generally planar, with the outer edge 50 defining a front surface 78. The front surface 78 of the display 22 can be shaped to correspond to and fit within the shape of the viewing area 40 of the display mirror assembly 10. Alternatively, the display 22 may have a front surface 78 which fits within, but is not complementary to the viewing area 40, for example, where the front surface 78 of the display 22 is generally rectangular and the front surface 42 of the glass element 12 has a contoured outer perimeter 46. The distance between the outer edge 50 of the display 22 and the outer perimeter 46 of the glass element 12 is about 9 mm or less along at least a portion of the outer edge 50. In one embodiment, the display 22 has a viewable front surface 78 area which is about 56% to about 70% of the viewing area 40 of the glass element 12.

The display 22 may be LCD, LED, OLED, plasma, DLP or other display technology. The display 22 further includes a flexible electrical connector 80 which is operably mechanically and electrically connected with the primary PCB 28. The flexible electrical connector 80 has a length L which is sufficient to wrap around the display module 18 components between the display 22 and the primary PCB 28, and has a width which extends substantially along a top edge 82 of the display 22. The flexible electrical connector 80, when operatively connected to the primary PCB 28, aids in securing the components along a top edge of the display module 18.

As shown in FIGS. 5-6, the optic block 24 includes a front side 90 which is facing the display 22, a rear side 92 which is facing the heat sink 26, and an outer perimeter 94. The optic block 24 further includes tabs 96 extending generally outwardly therefrom around at least a portion of the outer perimeter 94. The tabs 96 are received through the holes 76 in the rearwardly directed tabs 74 of the front shield 14, to operably mechanically engage the optic block 24 with the front shield 14. The optic block 24 further includes at least one screw-receiving element 98 on the rear side 92 thereof. The screw-receiving element 98 is adapted to engage a screw 100 threaded through the rear shield 16 and the display module 18 components between the optic block 24 and the rear shield 16. In alternate embodiments, the tabs 96 for engaging the front shield 14, the screw-receiving elements 98, or both, could be provided on different components of the display module 18.

As shown in FIGS. 4 and 6, a glare sensor 102 is provided on the front side 90 of the optic block 24, in a location which receives light through the glass element 12, and which is not behind the display 22. The glare sensor 102 is snap-fit into a receiving aperture 104 in the optic block 24. The glare sensor 102 receives light from headlamps of a trailing vehicle, and measures information regarding the likely glare visible on the glass element 12 and communicates this information to the display mirror assembly 10 so that the display mirror assembly 10 can be optimized to allow viewing of the display 22 through the glass element 12. The glare sensor's 102 optical vertical/horizontal pattern is symmetrical, so that orientation of the glare sensor 102 is not significant. The glare sensor 102 could also be packaged at least partially within the housing 30 of the display mirror assembly 10 and have a light guide which is configured to propagate light to the glare sensor 102. The glare sensor 102 could also be an imager on a rear portion of the vehicle, wherein a signal representative of the received light is communicated from the glare sensor 102 to the display mirror assembly 10.

As shown in FIGS. 5-6, the heat sink 26 is disposed rearwardly from the optic block 24, and dissipates heat generated by the primary PCB 28 and other components of the display module 18. The heat sink 26 has a generally planar body 110 with a front side 112 and a top edge 114. A channel 116 extends along the top edge 114 of the heat sink 26, and defines a forward-facing opening 118. An edge lit PCB 120 and a gap filler 122 are disposed partially within the channel 116, with the edge lit PCB 120 extending generally perpendicularly from the heat sink 26 in a forward direction, and having an operable side which is facing downward, away from the top edge 114. The edge lit PCB 120 includes a wiring adapted for electrical connection with the primary PCB 28, to permit electrical power and signals to be supplied to the edge lit PCB 120. A plurality of tabs 128 extend upwardly from the top edge 114 of the heat sink 26, for mechanical engagement with the rear shield 16.

The heat sink 26 also includes at least one hole 130 therethrough to receive a screw 100 threaded from the rear shield 16 to the optic block 24. The screw-receiving element 98 of the optic block 24 is optionally raised, to extend through the hole 130 in the heat sink 26 and receive the screw 100. The screw-receiving element 98 of the optic block 24 may also aid in alignment of display module 18 components during manufacturing and will provide additional reinforcement to the display module 18 in the interaction between components if it is raised.

The primary PCB 28 operates to provide electrical power and control for the components of the display module 18 and for the glass element 12. As shown in FIGS. 5-6, the primary PCB 28 is generally planar, with a front side 140, a rear side 142, and side edges 144. The front side 140 is facing the heat sink 26 and the rear side 142 is facing the rear shield 16. Electrical components are generally oriented on the rear side 142 of the primary PCB 28. The primary PCB 28 includes an electrical connector for operable electrical engagement with the electrical element wires of the glass element 12, an electrical connector for operable electrical engagement with the flexible electrical connector 80, and an electrical connector for operable electrical engagement with the wiring harness. Additional functional elements that may be provided on the display mirror assembly 10 may also be electrically connected to the primary PCB 28, such as the glare sensor 102 and any other functional buttons or features of the display mirror assembly 10. The primary PCB 28 further includes side cutouts 150 along the side edges 144, to permit passage of the screws 100 used to secure the rear shield 16 to the components of the display module 18.

The rear shield 16 functions to shield the display module 18 from RF radiation. As best shown in FIGS. 4-5, the rear shield 16 also serves to encapsulate the display module 18, and further interlock the components of the display mirror assembly 10. The rear shield 16 is formed from a material which is suitable to block such radiation and provide the desired support for the display mirror assembly 10, such as steel. As a non-limiting example, the rear shield 16 can be formed from stamped steel with a thickness of about 0.381 mm.

As shown in FIG. 6, the rear shield 16 includes a rear wall 160 having an outer perimeter 162, and a peripheral wall 164 extending forwardly from the rear wall 160 about at least a portion of the outer perimeter 162. The peripheral wall 164 has slots 166 therein, which correspond to the upstanding tabs 128 along the top edge 114 of the heat sink 26 and are operably mechanically engageable therewith. The rear shield 16 further includes at least one hole 168 therethrough to accommodate the screw 100, where the screw 100 extends through the rear shield 16 and into the components of the display module 18 to secure the rear shield 16 to the display module 18. The screw 100 extends through the rear wall 160 of the rear shield 16, through the side cutouts 150 of the primary PCB 28, through the heat sink 26, and is secured to the screw-receiving element 98 on the rear side 92 of the optic block 24.

The rear housing 30 includes a forwardly directed cavity 170, into which all or a portion of the front shield 14, rear shield 16, and the display module 18 supported therebetween are inserted. The rear housing 30 includes mechanically engaging features 172 which snap fit with corresponding engagement features 174 located on the peripheral wall 164 of the rear housing 30 or on a display module 18 component such as the heat sink 26. The mounting member 32 is operably engaged with the rear housing 30 in any known manner.

With respect to the following description, the display mirror assembly 10 is considered "on axis" when adjusted so that the reflected image from the glass element 12 shows a viewer (e.g. operator) a view out of the rear window of the vehicle. Due to the display 22 being viewed through the glass element 12, any glare on the glass element 12 may interfere with the visibility of the display 22. When the display mirror assembly 10 is on axis and is being used during night time driving conditions, headlights from a trailing vehicle (i.e., a vehicle driving behind the vehicle with the display mirror assembly 10) can cause a glare which is visible to the driver. Additionally, during daytime driving conditions ambient scene reflections can cause a glare which is visible to the driver.

According to one embodiment of the present invention, an actuator device 176, as shown in FIGS. 2 and 6, is operably coupled to the display mirror assembly 10. When actuated, the actuator device 176 may toggle the glass element 12 and corresponding support assembly between the "on-axis" position and the "off axis" position (i.e., away from a direct line toward the driver's eyes). In this way, the actuation of the actuator device 176 tilts the glass element 12 upwards, to move the mirror assembly 10 to an off-axis position. However, it should be appreciated that the actuator device 176 can be configured to move the mirror assembly 10 in any direction with respect to the axis. Additionally, in an exemplary embodiment, the actuator device 176 can also be configured to turn the display 22 on or off. In this configuration, when the actuator device 176 is actuated to move the mirror assembly 10 off-axis, the display 22 can be turned on. When the actuator device 176 is actuated to move the mirror assembly 10 on-axis, the display 22 can be turned off.

Figure 7:
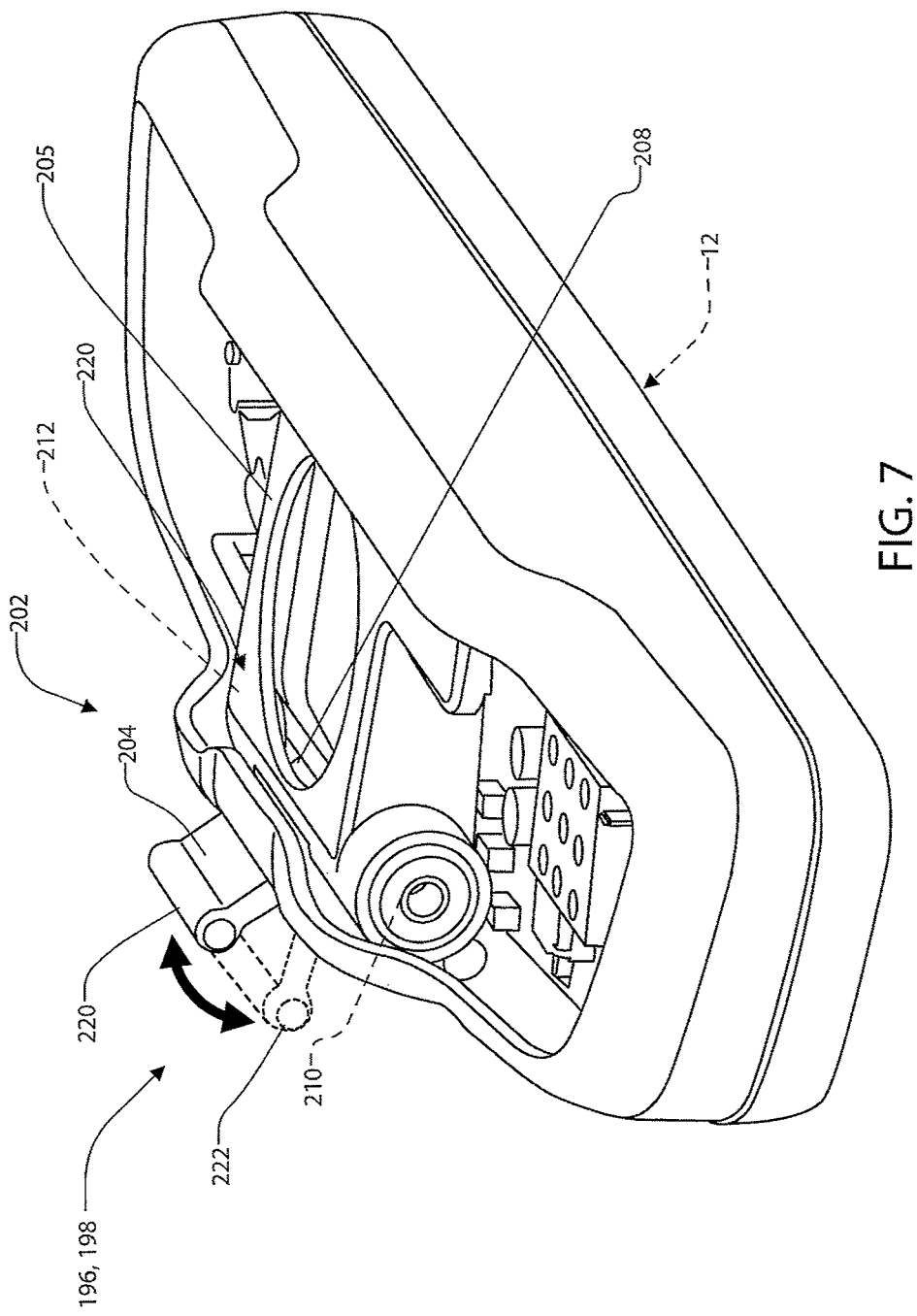
FIG. 7 is a perspective view of an adjusting assembly that may be incorporated with the display mirror.

Referring now to FIG. 7, the actuator device 176 may be configured to form a smooth adjusting assembly by incorporating a soft adjust mechanism 198. In an exemplary implementation, the smooth adjusting assembly may be implemented as a toggle mechanism 202. The toggle mechanism 202 may be utilized in the assembly 10 to perform similar functions to the actuator device as discussed herein, and as such, like reference numerals are utilized to discuss like components for clarity. The soft adjust mechanism 198 may be configured to prevent a jarring or snapping motion attributed to toggling an actuator device 176 between a first position to a second position to adjust an axial alignment of the assembly 10 as discussed herein.

The toggle mechanism 202 may be configured to move or adjust the angular position of the glass element 12. The toggle mechanism 202 may comprise a lever 204 configured to pivotally engage a housing 205 of a positioning assembly 206 via an axial engagement portion 208. As discussed herein, the toggle mechanism 202 may form a portion of the positioning assembly 206, which may be configured to adjust an angular position of the glass element 12. Further, the positioning assembly 206 may correspond to the soft adjust mechanism 198. The axial engagement portion 208 may comprise a first engagement end portion 210 and a second engagement end portion 212. In this configuration, the toggle mechanism 202 may be manually actuated by a passenger or operator of a vehicle to toggle the mirror assembly 10 between the on-axis or off-axis position relative to a reflected line of sight directed toward the eyes of the operator.

Referring now to FIGS. 7, 8A, and 8B, the positioning assembly 206 may comprise a positioning housing 205 forming a first engaging aperture 214 and a second engaging aperture 216 configured to receive the first engagement end portion 210 and the second engagement end portion 212, respectively. The toggle mechanism 202 may be rotated about a first pivotal axis 218 from a first position 220 to a second position 222 as demonstrated by the arrow in FIG. 7. The first position 220 may correspond to an on-axis position wherein the glass element 12 is on-axis to direct the reflected line of sight to the operator of the vehicle. Additionally, in the first position 220, the positioning assembly 206 may further be configured to control the display 22 to an off-state.

The second position 222 may be configured to orient the toggle mechanism 202 in the off-axis position. Additionally, in the second position 222, the positioning assembly 206 may further be configured to control the display 22 to an on-state. As discussed herein, changing from the second position 222 to the first position 220 may be manually actuated by a passenger of the vehicle to simultaneously adjust the glass element 12 to an on-axis position and control the display 22 to an off-state. This novel functionality may provide for simple and accurate operation of the positioning assembly 206. In this configuration, the display 22 may be selectively activated and deactivated in the second position 222 (e.g. off-axis) and the first position 220 (e.g. on-axis), respectively, such that light reflected from the glass element 14 does not interfere with the light emitted from the display 22.

Changing from the first position 220 to the second position 222 may also be manually actuated to simultaneously adjust the glass element 12 to an off-axis position and activate the display 22. In off-axis configuration, the reflected field of view of the glass element 12 is directed toward a headliner of the vehicle and away from the eyes of the operator. In this way, the image data on the display 22 may be visible to an operator without viewing light reflected from the assembly 10. As further discussed in reference to FIGS. 8A and 8B, the positioning assembly 206 may comprise a damper 224 configured to control the rotational movement about the first pivotal axis 218 of the axial engagement portion 208 of the toggle mechanism 202 from a first position 220 to a second position 222 and vice versa.

Referring now to FIGS. 8A and 8B, the positioning assembly 206 and toggle mechanism 202 are shown, respectively. The positioning assembly 206 may form an intermediate connection between the mounting member 32 and the rear housing 30 of the mirror assembly 10 as shown previously in FIG. 4. For example, the mounting member 32 may be configured to connect to a receiving member 230 of the positioning assembly 206. Additionally, the housing 205 may be in pivotal connection with the receiving member 230 via a second pivotal axis 232. The second pivotal axis 232 may be formed by a second pivoting assembly 234 formed by a fulcrum pin 236 of the receiving member 230 and a plurality of rotational brackets 238 of the housing 205. In this configuration, the housing 205 may rotate about the fulcrum pin 236 in response to the toggle mechanism 202 being adjusted from the first position 220 to the second position 222.

As previously discussed, the toggle mechanism 202 may be configured to pivotally engage the housing 205 via the first engagement end portion 210 and the second engagement end portion 212. The first engagement end portion 210 and the second engagement end portion 212 may be configured to connect with the first engaging aperture 214 and the second engaging aperture 216 to define the first pivotal axis 218. The toggle mechanism 202 may further form a lateral displacement arm 240 configured to engage a lever aperture 242 formed in a distal end portion 244 of the receiving member 230. In this way, the housing 205 may be moved relative the mounting member 32.

The housing 205 may further be connected to the rear housing 30 via a plurality of fastener apertures 239. A plurality of fasteners may interconnect fastening tabs of the housing 205 forming the fastener apertures 239 to the rear housing of the mirror assembly 10. In this configuration, the receiving member 230 forms a lever configured to adjust the angular orientation of the rear housing 30 and the mirror assembly 10. In this way the glass element 12 may be shifted from the on-axis position to the off-axis position as discussed herein.

In operation, the lever 204 of the toggle mechanism 202 may be rotated about the first pivotal axis 218 to adjust the position of the lateral displacement arm 240. The motion of the lateral displacement arm 240 may cause the distal end portion 244 of the receiving member 230 to similarly move due to the engagement of the lateral displacement arm 240 and the lever aperture 242. The motion of the receiving member 230 may further result in a change in an angle of the receiving member 230 relative to the housing 205. The change in the angle between the receiving member 230 and the housing 205 may result in the rear housing 30 and consequently, the mirror assembly 10 being adjusted from the first position 220 to the second position 222.

The movement from the first position 220 to the second position 222 is controlled by the damper 224. The damper 224 may correspond to a rotational damper comprising a rotating portion 250 in connection with the first engagement end portion 210 and a fixed portion 252 in connection with the housing 205 via an engaging sleeve 254 formed by or in connection with the housing 205. The rotational movement of the rotating portion 250 relative the fixed portion 252 is controlled or dampened such that the lever 204 of the toggle mechanism 202 moves smoothly from the first position 220 to the second position 222.

The damper 224 may correspond to various forms of rotational dampers. For example, the damper 224 may correspond to a viscous damper having rigid plastic structure. In some embodiments, the damper 224 may correspond to a rotary or rotational damper configured to limit a rate of change of rotational motion of the toggle mechanism 202 about the first pivotal axis 218. In some embodiments, the damper 224 may similarly be implemented as a lateral damping mechanism configured to limit the lateral movement of the lateral displacement arm 240, which may be anchored to the housing 205. As discussed herein, the damper 220 may provide for controlled movement of the positioning assembly 206 relative the receiving member 230 to control the movement of the mirror assembly 10.

Though discussed in detail in reference to the mirror assembly 10, the positioning assembly 206 incorporating the damper 224 may be utilized in a variety of display mirrors and/or prism mirrors. For example, the mirror assembly may be utilized in a conventional prism mirror of a vehicle comprising a positioning assembly configured to adjust an angular orientation of a glass element or mirror assembly. Such a mirror may correspond to a two-position prism mirror such as that discussed in U.S. Pat. No. 3,740,122 A, which is incorporated herein by reference in its entirety.

Referring now to FIGS. 9A, 9B, 10A, and 10B, an exemplary embodiment of an actuator assembly 300 configured to adjust a rotational orientation of the glass element 12 is shown. For example, the actuator assembly 300 may be configured to adjust the glass element 12 from the off-axis position to an on-axis position. The actuator assembly 300 may be implemented similar to the actuator device 176 and may be configured to move the glass element 12 upon activation of the display 22. The actuator assembly 300 may be configured to turn the display 22 on or off via a switch device 302. The switch device 302 may be configured to identify when the actuator assembly 300 and the glass element 12 are arranged in the off-axis position or the on-axis position.

The actuator assembly 300 may comprise a toggle switch 304 configured to adjust an orientation of the glass element 12. The toggle switch 304 may engage a support bracket 306 and a rotational damper 308 or barrel damper along a first pivotal axis 310. An engaging portion 312 of the toggle switch 304 and an engaging surface 314 of the rotational damper 308 may form a pivotal interface 316 configured to engage a first channel 318 or trough formed by the support bracket 306. The pivotal interface 316 may be substantially cylindrical in shape and may form a camshaft configured to engage a corresponding interior surface of the first channel 318.

The engaging surface 314 of the rotational damper 308 may comprise a locating feature 320 configured to engage a complementary receiving aperture (not shown) formed in the first channel 318. Additionally, the engaging portion 312 of the toggle switch 304 may engage the rotational damper 308 such that the toggle switch 304 and a damped cylinder 322 within of the rotational damper 308 rotate together about the first pivotal axis 310. In this configuration, a rotation of the toggle switch 304 and the damped cylinder 322 may be locked such that the rotation of the toggle switch 304 is damped about the first pivotal axis 310 by the rotational damper 308 relative to the support bracket 306.

As discussed herein, the pivotal interface 316 of the actuator assembly 300 may be configured to form a smooth adjusting assembly. The rotational damper 308 may be configured to engage the support bracket 306, which may further be in connection with the primary PCB 28. As such, the support bracket 306 and the actuator assembly 300 may correspond to an example of a positioning assembly 324 that may be configured to engage a mounting member. The mounting member may be similar to the mirror mount 32 and have a socket configured to engage a ball adaptor 326. In this configuration, the mounting member may be adapted for mounting on a windshield of a vehicle to secure a mirror assembly (e.g. the mirror assembly 10).

The toggle switch 304 may form a second channel 328 or trough configured to receive an engaging member 330 of a slider component 332 proximate a first end portion 334 of the slider component 332. The slider component 332 may form a plurality of spring guide slots 336 and corresponding pivot plate slots 338. Each of the pivot plate slots 338 may be configured to receive an engaging portion 340 of a pivot plate 342 proximate a second end portion 344 of the slider component 332. A slider spring 346 may be disposed in each of the spring guide slots 336 and may also engage a receiving pocket 348 formed by the pivot plate 342. In this configuration, a rotation of the toggle switch 304 may cause the engaging member 330 to translate in response to the movement of the second channel 328.

The movement of the engaging member 330 may result in a translation of the slider component 332, which may cause a compression or expansion of the slider springs 346. The pivot plate 342 may form at least one pivoting member 350 configured to engage at least a third channel 352 or trough formed by the support bracket 306. Additionally, the pivot plate may form an arm 354 configured to support the ball adaptor 326 proximate a distal end portion 356. In this configuration, the pivot plate 342 may rotate about the at least one pivoting member 350, which may be aligned along a second pivotal axis 358. In this configuration, a rotational movement of the toggle switch 304 about the first pivotal axis 310 may induce the translation of the slider component 332. The rotational movement of the toggle switch 304 may further result in a rotation of the pivot plate 342 about the second pivotal axis 358.

The rotation of the pivot plate 342 may result in the adjustment of the angular position of the glass element 12 from a first position 360 to a second position 362 and vice versa. As illustrated in FIG. 9B, the pivot plate 342 is shown in the second position 362, which may correspond to an off-axis orientation. The second position 362 may correspond to the off-axis orientation in which the line of sight from the glass element is directed away from the eyes of an operator. FIG. 9B further demonstrates a partially transparent view demonstrating the pivot plate 342 in the first position 360. The first position 360 may correspond to the on-axis orientation in which the line of sight from the mirror is directed toward the eyes of an operator as shown in FIG. 10A.

An arrow 363 demonstrated in FIG. 9B may provide an exemplary direction extending from the slider component 332 and a blade 364 or protrusion in the second position 362. The arrow 363 may further demonstrate a direction extending to the slider component 332 and the blade 364 in the first position 360. Additionally, the second position 362 may also correspond to the position of the toggle switch 304 as illustrated in FIGS. 9A and 10B. The first position 360 may correspond to the position of the toggle switch 304 as illustrated in FIG. 10A.

The slider component 332 may comprise the blade 364 or protrusion extending from the slider component 332 toward the primary PCB 28. A sensor 366 may be disposed on the primary PCB 28 on a rear side directed toward the slider component 332. In this configuration, the blade 364 of the slider component 332 may translate into and out of a valley 368 or channel formed by the sensor 366 in response to the toggle switch 304 being arranged in the first position 360 or the second position 362, respectively. In response to the presence of the blade 364 being located in the valley 368, the sensor 366 may identify that the toggle switch 304 is positioned in a corresponding position. For example, the controller may identify that the toggle switch is located in the first position 360. In response to the detection of the blade 364 in the valley 368, the controller may activate or deactivate the display.

The sensor 366 may correspond to various forms of sensors and/or sensory devices that may be operable to detect the presence of an object in proximity thereto. For example, the sensor 366 may correspond to a capacitive sensor, an inductive sensor, a magnetic sensor, an optical sensor, etc. In an exemplary embodiment, the sensor 366 may correspond to an optical sensor comprising an emitter and a receiver. The emitter and the receiver may be configured to generate and detect an emission from a first protruding member 370 to a second protruding member 372. The first protruding member 370 and the second protruding member 372 may form the valley 368 aligned with and configured to receive the blade 364. In this configuration, the sensor 366 may detect the toggle switch 304 in the first position 360 and the second position 362.

For example, in response to positioning of the toggle switch 304 in the first position 360, the pivot plate 342 and the slider component 332 may rotate toward the primary PCB 28. The rotation of the slider component 332 toward the primary PCB 28 may cause the blade 364 or protrusion to pass into the valley 368 formed by the sensor 366. In an exemplary embodiment wherein the sensor 366 corresponds to an optical sensor, the emission passing from the emitter to the receiver may be blocked by the blade 364. The blockage of the emission may be detected by a controller in communication with the sensor 366. In response to the detection of the blockage, the controller may control the display 22 to an 'OFF' condition.

In response to positioning of the toggle switch 304 in the second position 362, the pivot plate 342 and the slider component 332 may rotate away from the primary PCB 28. The rotation of the slider component 332 away from the primary PCB 28 may cause the blade 364 or protrusion to move out of the valley 368 formed by the sensor 366. In an exemplary embodiment wherein the sensor 366 corresponds to an optical sensor, the emission passing from the emitter to the receiver may be received by the receiver. The receipt of the emission may be detected by a controller in communication with the sensor 366. In response to the detection, the controller may control the display 22 to an 'ON' condition.

To provide information to the viewer of the display mirror assembly 10, the display mirror assembly 10 may include information regarding the field of view 178, such as a partially transmissive graphic overlay or an image on the display 22 visible on the viewing area 40 when the display mirror assembly 10 is in use.

In order to construct the display mirror assembly 10 described herein, the J-clips 54 are installed on the glass element 12, and then element wires are soldered to the top portion of the J-clips 54. The glass element 12 is then secured to the front side 64 of the front shield 14, using the foam adhesive 72 and the forward retaining features 70 of the front shield 14. The front shield 14 is then inverted, with the glass element 12 facing downwardly on a protective surface.

A first subassembly 180 (FIG. 5), including the display 22 and optic block 24, is assembled by snap-fitting the glare sensor 102 into the receiving aperture 104 in the optic block 24, and adhering the display 22 to the optic block 24. The adhesion of the display 22 and optic block 24 may include coating the front side 90 of the optic block 24 with an adhesive and applying a release liner over the adhesive, wherein the release liner is easily removable from the adhesive. When it is time to assemble the display 22 and optic block 24, the release liner is removed, and the display 22 is positioned on the front side 112 of the optic block 24. To position the display 22, one edge of the display 22 is aligned in the appropriate location on the optic block 24, and then the display 22 is rotated into contact with the front side 90 of the optic block 24. The first subassembly 180 is placed in position on the rear side 66 of the front shield 14. The tabs 96 extending outwardly from the optic block 24 are inserted through the holes 76 in the rearwardly directed tabs 74 of the front shield 14.

A second subassembly 182 (FIG. 5), including the heat sink 26 and edge lit PCB 120, is assembled. To assemble the second subassembly 182, the gap filler 122 is adhered to the edge lit PCB 120. The adhesion may include coating one side of the gap filler 122 with adhesive and then applying the gap filler 122 to the edge lit PCB 120 so that it does not interfere with the operable side of the edge lit PCB 120. The gap filler 122 and edge lit PCB 120 are then inserted into the opening in the channel 116 on the front side 112 of the heat sink 26. Locating features are optionally provided on the heat sink 26, the edge lit PCB 120 or both, to aid in inserting the side lit PCB and gap filler 122 into the channel 116. The second subassembly 182 is placed in position on the rear side 92 of the optic block 24. The screw-receiving elements 98 extending rearwardly from the optic block 24 extend through the holes 130 in the heat sink 26.

The primary PCB 28 is placed above the top edge of the second subassembly 182, with the front side 140 facing upwards. The flexible electrical connector 80 from the display 22 is mated with the electrical connector therefor. The primary PCB 28 is then rotated 180 degrees about the top edge of the second subassembly 182, so that the front side 140 is in contact with the heat sink 26. When rotating the primary PCB 28, the flexible electric connector is wrapped over the top edge of at least a portion of the display module 18. The element wires are electrically connected with the electrical connectors, and the wiring harness for the edge lit PCB 120 is connected with the electrical connector therefor.

As shown in FIGS. 4-5, the rear shield 16 is placed over the primary PCB 28, and the tabs 128 extending upwardly from the heat sink 26 are engaged with the slots 166 on the peripheral wall 164 of the rear shield 16. At least one screw 100 is inserted through the screw holes 168 in the rear shield 16, through the side cutouts 150 in the PCB, through the heat sink 26, and into the screw-receiving elements 98 on the optic block 24. It is desirable that two to three screws 100 are affixed in this manner.

The forwardly directed cavity 170 of the rear housing 30 is placed over the rear shield 16, and the mechanically engaging features 172 of the rear housing 30 are snap fit to engage with the corresponding engagement feature 174 of the heat sink 26. The mounting member 32 may be installed in the rear housing 30 prior to assembly.

The present disclosure may be used with a mounting system such as that described in U.S. Pat. Nos. 8,814,373; 8,201,800; 8,210,695; 9,174,577; 8,925,891; and 9,838,653; and U.S. Provisional Patent Application Nos. 61/709,716; 61/707,676; and 61/704,869, which are hereby incorporated herein by reference in their entirety. Further, the present disclosure may be used with a rearview packaging assembly such as that described in U.S. Pat. Nos. 8,814,373; 8,646, 924; 8,643,931; 8,264,761; and 9,838,653; and U.S. Provisional Patent Application Nos. 61/707,625; and 61/590,259, which are hereby incorporated herein by reference in their entirety. Additionally, it is contemplated that the present disclosure can include a bezel such as that described in U.S. Pat. Nos. 8,827,517; 8,210,695; and 8,201,800, which are hereby incorporated herein by reference in their entirety.

A display mirror assembly according to the present disclosure has several advantages. The display module is supported by the front shield and rear shield, and does not require a separate support or carrier plate. Omission of a carrier plate, and inclusion of retaining features in the front shield and rear shield, permits the display mirror assembly to be lighter, involve less parts for manufacturing, and to have a display which is viewable over a larger percentage of the total viewing area of the display mirror assembly.

It will be appreciated that embodiments of the invention described herein may be comprised of one or more conventional processors and unique stored program instructions that control one or more processors to implement, in conjunction with certain non-processor circuits, some, most, or all of the functions of a display mirror assembly 10, as described herein. The non-processor circuits may include, but are not limited to signal drivers, clock circuits, power source circuits, and/or user input devices. As such, these functions may be interpreted as steps of a method used in using or constructing a classification system. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, the methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

It will be understood by one having ordinary skill in the art that construction of the described invention and other components is not limited to any specific material. Other exemplary embodiments of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. An actuator assembly for a vehicle mirror comprising:
a toggle switch configured to rotate about a pivotal axis;
a damper in connection with the toggle switch and configured to control the rotation about the pivotal axis; and
a support bracket in connection with the vehicle mirror and forming a pivotal interface with the damper and the toggle switch, wherein the pivotal interface is configured to toggle an orientation of the vehicle mirror between a first position and a second position, wherein the first position corresponds to an on-axis position wherein the mirror is oriented by the support bracket to direct a rearward directed reflection to an operator of the vehicle.

2. The actuator assembly according to claim 1, wherein the second position corresponds to an off-axis position wherein the mirror is oriented by the support bracket to direct a rearward directed reflection away from the operator of the vehicle.

3. The actuator assembly according to claim 1, wherein the damper is a rotational damper configured to engage a trough formed by the support bracket.

4. The actuator assembly according to claim 3, wherein the rotational damper comprises an engaging surface forming the pivotal interface in assembly with the trough of the support bracket.

5. The actuator assembly according to claim 4, wherein the damper comprises a locating feature configured to engage a receiving aperture formed in the support bracket.

6. The actuator assembly according to claim 5, wherein the locating feature is configured to retain an orientation of the engaging surface relative to the trough.

7. The actuator assembly according to claim 6, wherein the damper comprises a rotating portion in connection with the toggle switch.

8. The actuator assembly according to claim 7, wherein the rotating portion applies a damping force to the toggle switch through the engaging surface in response to a rotation of the pivotal interface from the first position to the second position.

9. A mirror assembly for a vehicle, comprising:
a support bracket;
a glass element operably coupled with the support bracket;
an actuator assembly in connection with the support bracket, wherein the actuator assembly is adjustable to tilt the glass element between a first position and a second position;
a damper in engagement with the actuator assembly and the support bracket, wherein the damper controls a movement of the actuator assembly between the first position and the second position; and
a sensor configured to detect a position of the actuator assembly.

10. The mirror assembly according to claim 9, wherein the sensor forms a channel configured to receive a protrusion of the actuator assembly.

11. The mirror assembly according to claim 10, wherein the protrusion extends outward from the actuator assembly and into the channel in the first position.

12. The mirror assembly according to claim 11, wherein the protrusion is withdrawn from the channel in the second position.

13. The mirror assembly according to claim 9, wherein the sensor corresponds to an optical sensor.

14. The mirror assembly according to claim 9, further comprising a control circuit in communication with the sensor, wherein the control circuit is configured to activate a display in response to the actuator assembly located in the second position.

15. The mirror assembly according to claim 14, wherein the control circuit is further configured to deactivate the display in response to the actuator assembly located in the first position.

16. A mirror assembly for a vehicle, comprising:
a support bracket;
a display screen comprising a display surface configured to display image data;
a glass element disposed on the display surface and operably coupled with the support bracket;
an actuator assembly in connection with the support bracket, wherein the actuator assembly is adjustable to tilt the glass element between a first position and a second position;
a damper in engagement with the actuator assembly and the support bracket, wherein the damper controls a movement of the actuator assembly between the first position and the second position; and
a sensor configured to detect a position of the actuator assembly.

17. The mirror assembly according to claim 16, wherein the actuator assembly comprises a protrusion, the protrusion extending outward from the actuator assembly and into a detection region of the sensor in the first position.

18. The mirror assembly according to claim 17, wherein the protrusion is withdrawn from the detection region in the second position.

19. The mirror assembly according to claim 17, further comprising a control circuit in communication with the sensor, wherein the control circuit is configured to deactivate the display screen in response to the detection of the protrusion in the detection region.

* * * * *